(12) United States Patent
Wilson

(10) Patent No.: US 12,206,399 B2
(45) Date of Patent: Jan. 21, 2025

(54) DEBOUNCED SOLID STATE SWITCHING DEVICE

(71) Applicant: Cummins Inc., Columbus, IN (US)

(72) Inventor: Oliver Daniel Wilson, Fridley, MN (US)

(73) Assignee: Cummins Inc., Columbus, IN (US)

( * ) Notice: Subject to any disclaimer, the term of this patent is extended or adjusted under 35 U.S.C. 154(b) by 18 days.

(21) Appl. No.: 17/922,556

(22) PCT Filed: May 14, 2020

(86) PCT No.: PCT/US2020/032844
§ 371 (c)(1),
(2) Date: Oct. 31, 2022

(87) PCT Pub. No.: WO2021/230870
PCT Pub. Date: Nov. 18, 2021

(65) Prior Publication Data
US 2023/0170896 A1  Jun. 1, 2023

(51) Int. Cl.
*H03K 17/567* (2006.01)
(52) U.S. Cl.
CPC ................... *H03K 17/567* (2013.01)
(58) Field of Classification Search
CPC .................................................. H03K 17/567
See application file for complete search history.

(56) References Cited

U.S. PATENT DOCUMENTS

| | | |
|---|---|---|
| 4,963,951 A | 10/1990 | Adler et al. |
| 6,906,356 B1 | 6/2005 | Chang |
| 2011/0249478 A1* | 10/2011 | Kuehner ............ H02M 7/48 363/131 |
| 2012/0098097 A1 | 4/2012 | Felsi et al. |
| 2017/0126115 A1 | 5/2017 | Schulz et al. |

OTHER PUBLICATIONS

International Search Report and Written Opinion for International patent application No. PCT/US2020/032844, filed May 14, 2020, mailed Aug. 19, 2020.

\* cited by examiner

*Primary Examiner* — Metasebia T Retebo
(74) *Attorney, Agent, or Firm* — Faegre Drinker Biddle & Reath LLP

(57) ABSTRACT

The present disclosure provides a debounced solid state switching device comprised of at least two insulated-gate bipolar transistors ("IGBTs") within a parallel architecture. Multiple pairs of IGBTs may be used in a parallel architecture to extend ampacity and improve voltage withstand capability. The device provides improved flexibility and portability to facilitate time and cost efficiency, as the size and complexity of the device is directly dependent on the needs of the user. Furthermore, the procurement of the components of the device is simple, providing greater accessibility.

11 Claims, 4 Drawing Sheets

DEBOUNCED SOLID STATE SWITCHING DEVICE

CROSS-REFERENCE TO RELATED APPLICATIONS

This application is a U.S. national stage of and claim priority to International Patent Application No. PCT/US2020/032844, filed May 14, 2020, the content of which is incorporated herein by reference in its entirety.

TECHNICAL FIELD OF THE PRESENT DISCLOSURE

The present disclosure generally relates to electrical circuits for making and breaking high AC or DC currents. Specifically, the present disclosure provides a device configured to make and break high AC or DC current quickly without resultant bounce chatter.

BACKGROUND OF THE PRESENT DISCLOSURE

The ability to make and break high AC or DC currents quickly is sought after in a number of applications where high electrical power is needed in a short period of time. For example, the ability to provide or remove high electrical current quickly from certain environments may be desired for testing of new electrical devices or for time efficient operation of large electrical devices.

Often, with quick making and breaking of current, mechanical switches experience contact bounce, or chatter, wherein the contacts of the switch bounce at least once before providing steady contact. Such chatter causes the electrical current to pulse, rather than provide full, steady current at the moment the switch is turned on to make the electrical current. Debouncing, or effort to eliminate the chatter, is known. Often, such solutions include the use of mercury, a low-pass filter, or testing of contact bounce at lower frequencies to determine the point at which the contacts settle and can be used without chatter. However, these solutions provide their own problems, hazards, and inefficiencies.

SUMMARY OF THE DISCLOSURE

The present disclosure provides a debounced solid state switching device comprised of at least two insulated-gate bipolar transistors ("IGBTs") within a parallel architecture. Multiple pairs of IGBTs may be used in a parallel architecture to extend ampacity and improve voltage withstand capability. The device provides improved flexibility and portability to facilitate time and cost efficiency, as the size and complexity of the device is directly dependent on the needs of the user. Furthermore, the procurement of the components of the device is simple, providing greater accessibility.

According to an illustrative embodiment of the present disclosure, a switching device is disclosed. The switching device comprises at least two modules coupled in a parallel architecture, each module comprising a first connection terminal coupled to a circuit pathway; a second connection terminal communicatively coupled to the first connection terminal via the circuit pathway, the second connection terminal comprising a first contact; and a switch terminal communicatively coupled to the circuit pathway, the switch terminal comprising a second contact. The switching device further comprises a controller communicatively coupled to the switch terminal of each module. The first connection terminal of each module is communicatively coupled to the other and the second connection terminal of each module is communicatively coupled to the other.

The switching device may further comprise a rectifying diode positioned between the first connection terminal and the second connection terminal. The switching device may be configured to switch between an on configuration and an off configuration. The first contact may be configured to selectively contact the switch terminal and the second contact may be configured to selectively contact the first connection terminal. The switching device may comprise at least four modules. The switching device may comprise at least six modules. Each module may be an insulated-gate bipolar transistor.

According to another embodiment of the present disclosure, a switching device is disclosed. The switching device comprises a controller; a first insulated-gate bipolar transistor communicatively coupled to the controller and comprising a first connection terminal and a second connection terminal; and a second insulated-gate bipolar transistor communicatively coupled to the controller and comprising a first connection terminal and a second connection terminal. The first connection terminal of the first insulated-gate bipolar transistor is communicatively coupled to the first connection terminal of the second insulated-gate bipolar transistor and the second connection terminal of the first insulated-gate bipolar transistor is communicatively coupled to the second connection terminal of the second insulated-gate bipolar transistor.

The switching device may further comprise a third insulated-gate bipolar transistor communicatively coupled to the controller, comprising a first connection terminal and a second connection terminal, and a fourth insulated-gate bipolar transistor communicatively coupled to the controller, comprising a first connection terminal and a second connection terminal. The first connection terminal of each of the first insulated-gate bipolar transistor, the second insulated-gate bipolar transistor, the third insulated-gate bipolar transistor, and the fourth insulated-gate bipolar transistor are communicatively coupled to each of the other first connection terminals. The second connection terminal of each of the first insulated-gate bipolar transistor, the second insulated-gate bipolar transistor, the third insulated-gate bipolar transistor, and the fourth insulated-gate bipolar transistor are communicatively coupled to each of the other second connection terminals.

Each of the first insulated-gate bipolar transistor and the second insulated-gate bipolar transistor may further comprise a rectifying diode positioned between the first connection terminal and the second connection terminal. The second connection terminal may comprise a contact to selectively place the second connection terminal in communication with the first connection terminal to close a module circuit. The switching device may have an on configuration, wherein the module circuit is closed, and an off configuration, wherein the module circuit is open.

In yet another embodiment of the present disclosure, a method of providing an electrical current is disclosed. The method comprises providing a signal to a switch terminal of a first module, the switch terminal comprising a first contact; closing the first contact so that the first contact contacts a first connection terminal of the first module; providing a signal to a second connection terminal of the first module, the second connection terminal comprising a second contact; and closing the second contact so that the second contact contacts the switch terminal. The first connection terminal is communicatively coupled to a third connection terminal of a second module, providing current between the first module and the second module. The second connection terminal is communicatively coupled to a fourth connection terminal of the second module, providing current between the first module and the second module.

The signal may be provided by a controller communicatively coupled to the switch terminal of the first module. The first module and the second module may comprise a parallel architecture.

Additional features and advantages of the present disclosure will become apparent to those skilled in the art upon consideration of the following detailed description of the illustrative embodiments exemplifying the disclosure as presently perceived.

BRIEF DESCRIPTION OF THE DRAWINGS

The detailed description of the drawings particularly refers to the accompanying figures in which.

Figure 1:
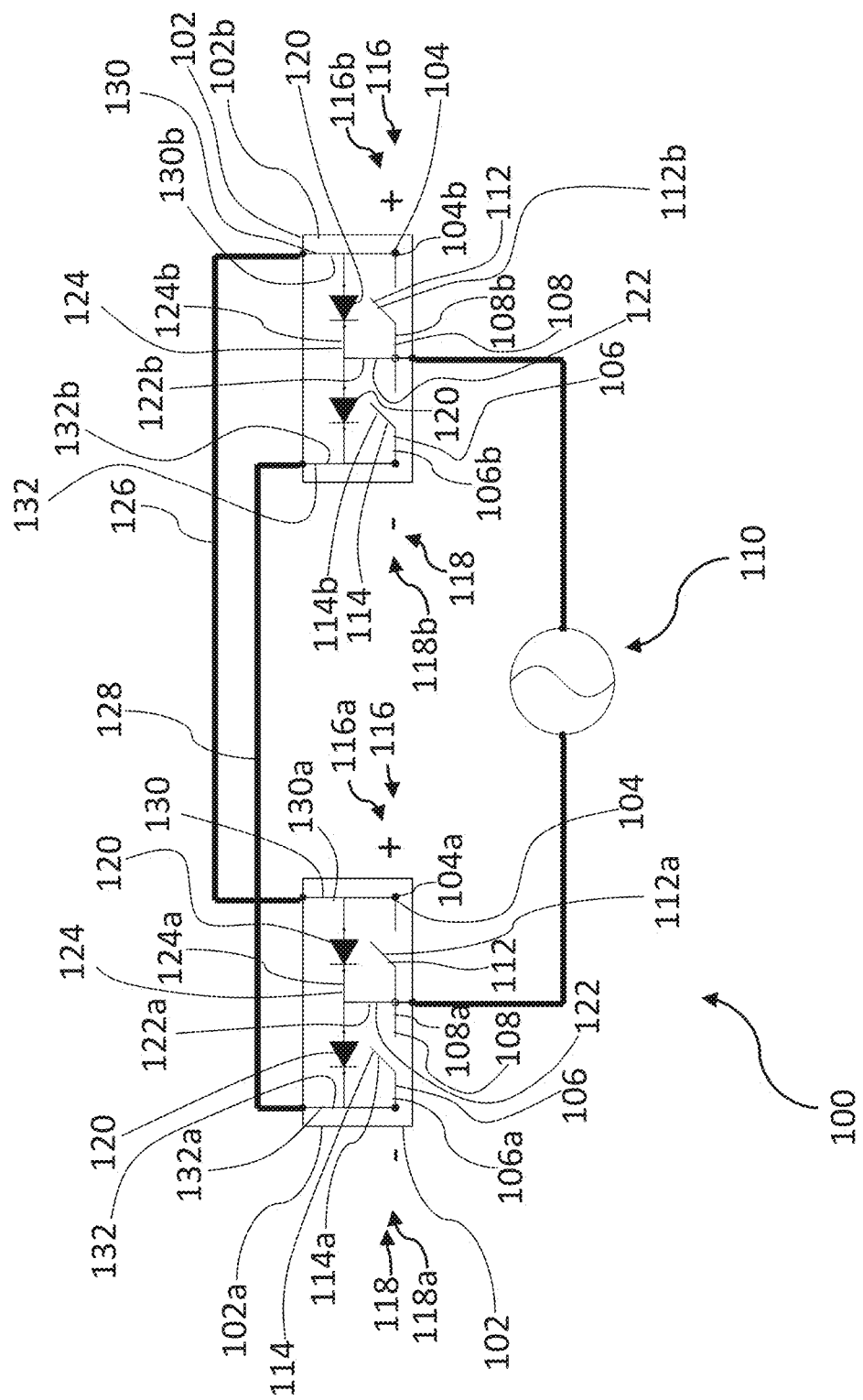
FIG. 1 is a schematic illustration of a switching device comprised of two insulated-gate bipolar transistor modules in an off configuration arranged in a parallel configuration, communicatively coupled to each other via communication pathways, and communicatively coupled to a controller configured to place the switching device in either an on configuration or the off configuration.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure. The exemplification set out herein illustrates an embodiment of the invention, and such an exemplification is not to be construed as limiting the scope of the invention in any manner.

DETAILED DESCRIPTION OF THE DRAWINGS

Referring to FIG. 1, a switching device 100 is disclosed. The switching device 100 includes a pair of modules 102, illustratively insulated-gate bipolar transistors ("IGBTs"). Each one of the modules 102 is a solid state module having three terminals, a first connection terminal 104 positioned near a positive end 116 of the module 102, a second connection terminal 106 positioned near a negative end 118 of the module 102, and a switch terminal 108 positioned between the first connection terminal 104 and the second connection terminal 106. The first connection terminal 104 and the second connection terminal 106 are communicatively coupled via a circuit pathway 124, and the switch terminal 108 is communicatively coupled to the circuit pathway 124 via a switch bypass 122.

The modules 102 are placed in a parallel architecture and are communicatively coupled back-to-back. In other words, a first connection terminal 104a of a first module 102a is communicatively coupled to a first connection terminal 104b of a second module 102b via a first connection pathway 126, while a second connection terminal 106a of the first module 102a is communicatively coupled to a second connection terminal 106b of the second module 102b via a second connection pathway 128. The first connection terminal 104 of each module 102 is communicatively coupled to the first connection pathway 126 via a first terminal pathway 130, and the second connection terminal 106 of each module 102 is communicatively coupled to the second connection pathway 128 via a second terminal pathway 132.

A first contact 112 is coupled to the switch terminal 108 of each module 102, and a second contact 114 is coupled to the second connection terminal 106 of each module 102. The first contact 112 selectively contacts the first connection terminal 104 of the same respective module 102 when the switching device 100 is in an on, or make, configuration. The second contact 114 selectively contacts the switch terminal 108 of the same respective module 102 when the switching device 100 is in the on configuration nearly simultaneously as the first contact 112 contacts the first connection terminal 104, as discussed further herein. As illustrated in FIG. 1, the switching device 100 is in the off configuration.

The switching device 100 includes a controller 110 communicatively coupled to each of a first switch terminal 108a of the first module 102a and a second switch terminal 108b of the second module 102b. The controller 110 is configured to switch the switching device 100 from an off, or break, configuration, wherein no current flows through the switching device 100, to the on configuration, wherein current flows through the switching device 100, including each of the first module 102a and the second module 102b, as discussed further herein. Each of the modules 102 includes a pair of rectified diodes 120 to direct the flow of the current when the device 100 is in a transitory configuration.

Figure 2:
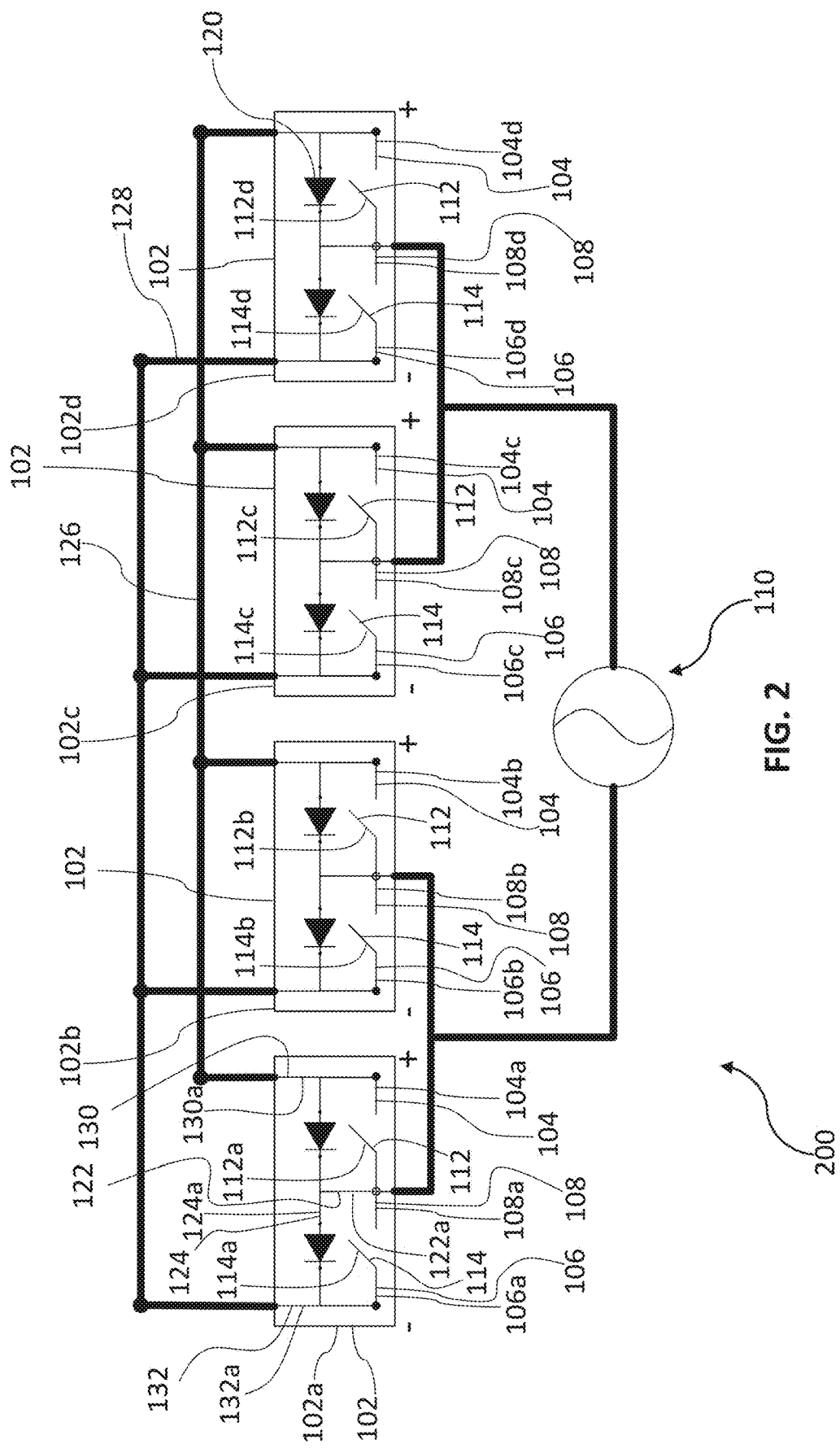
FIG. 2 is a schematic illustration of another switching device in an off configuration substantially similar to the switching device of FIG. 1, further comprising additional modules.

Now referring to FIG. 2, another embodiment of a switching device 200 is shown in the off configuration. The switching device 200 is substantially the same as the switching device 100, except the switching device 200 includes additional modules 102. For example, FIG. 2 includes modules 102a, 102b, 102c, and 102d. Each of the modules 102 include the same components described in reference to the switching device 100 discussed above in relation to FIG. 1, and the switching device 200 operates substantially the same as the switching device 100 as discussed above in relation to FIG. 1 and further described herein.

Like the switching device 100, the modules 102 of the switching device 200 are arranged in a parallel architecture and are communicatively coupled back-to-back. In other words, the first connection terminal 104a of the first module 102a, the first connection terminal 104b of the second module 102b, the first connection terminal 102c of the third module 102c, and the first connection terminal 102d of the fourth module 102d are all communicatively coupled to each of the other first connection terminals 104 of the other modules 102 via the connection pathway 126. Likewise, the second connection terminal 106a of the first module 102a, the second connection terminal 106b of the second module 102b, the second connection terminal 106c of the third module 102c, and the second connection terminal 106d of the fourth module 102d are all communicatively coupled to each of the other second connection terminals 106 of the other modules 102 via the connection pathway 128.

Figure 3:
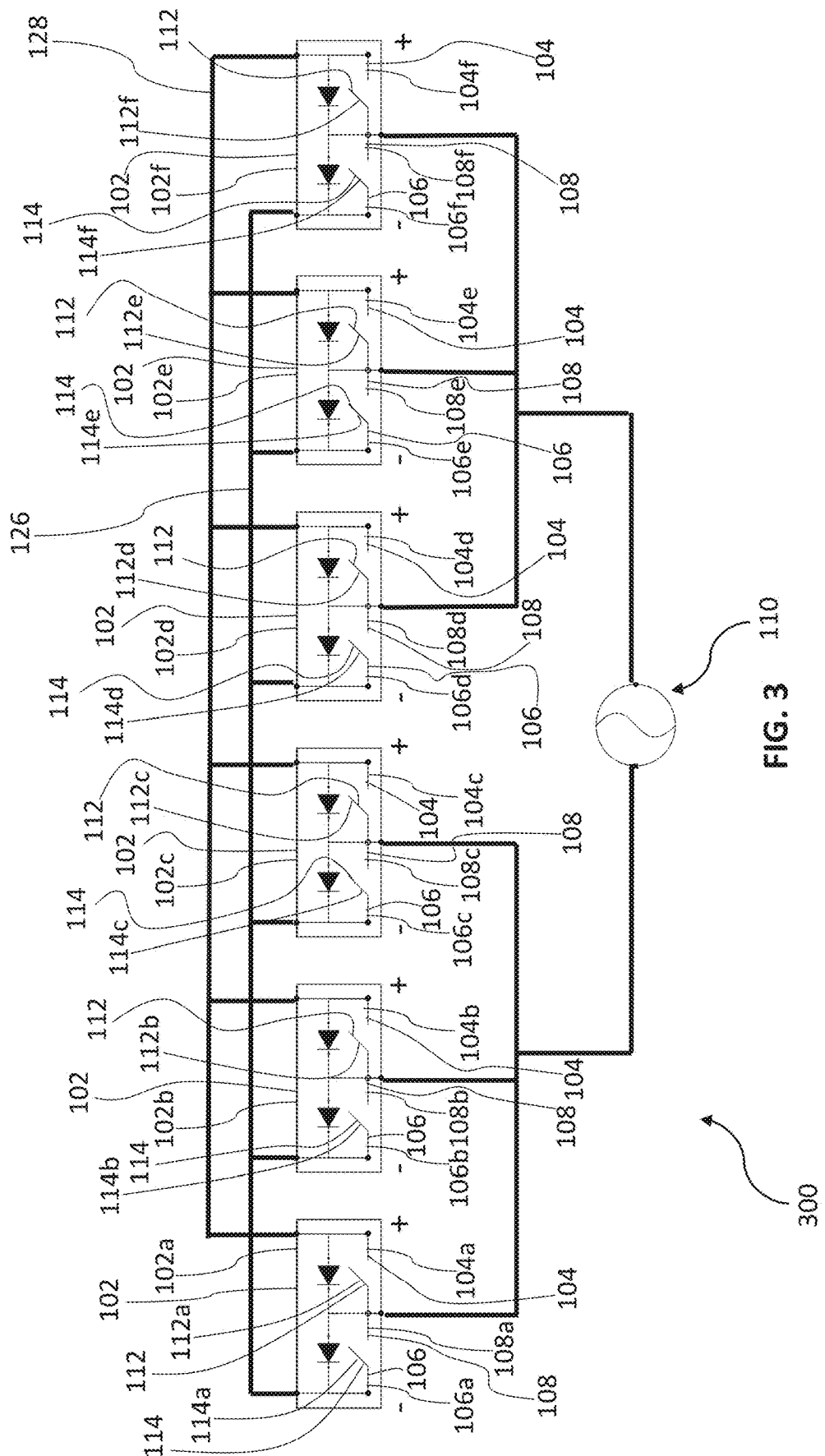
FIG. 3 is a schematic illustration of yet another switching device in an off configuration substantially similar to the switching devices of FIGS. 1 and 2, further comprising additional modules.

Now referring to FIG. 3, yet another embodiment of a switching device 300 is shown in the off configuration. The switching device 300 is substantially the same as the switching device 100 and 300, except the switching device 300 includes additional modules 102. For example, FIG. 3 includes modules 102a, 102b, 102c, 102d, 102e, and 102f. Each of the modules 102 include the same components described in reference to the switching device 100 discussed above in relation to FIG. 1 and the switching device 200 discussed above in relation to FIG. 2, and the switching device 300 operates substantially the same as the switching devices 100 and 200 and further described herein.

Like the switching devices 100, 200, the modules 102 of the switching device 300 are arranged in a parallel architecture and are communicatively coupled back-to-back. In other words, the first connection terminal 104a of the first module 102a, the first connection terminal 104b of the second module 102b, the first connection terminal 104c of the third module 102c, the first connection terminal 104d of the fourth module 102d, the first connection terminal 104e of the fifth module 102e, and the first connection terminal 104f of the sixth module 102f are all communicatively coupled to each of the other first connection terminals 104 of the other modules 102 via the connection pathway 126.

Likewise, the second connection terminal 106a of the first module 102a, the second connection terminal 106b of the second module 102b, the second connection terminal 106c of the third module 102c, the second connection terminal 106d of the fourth module 102d, the second connection terminal 106e of the fifth module 102e, and the second connection terminal 106f of the sixth module 102f are all communicatively coupled to each of the other second connection terminals 106 of the other modules 102 via the connection pathway 128.

As illustrated by FIGS. 2 and 3, the switching device may include as many modules 102 as needed to carry out the desired function of the switching device. As the number of modules 102 increases, the ampacity and voltage withstand capability of the switching device 100 increases. The switching device may comprise, for example, at least 2 modules 102, at least 4 modules 102, at least 6 modules 102, at least 8 modules 102, at least 10 modules 102, at least 12 modules 102, etc. until the desired ampacity and/or voltage withstand capability of the switching device is reached.

Figure 4:
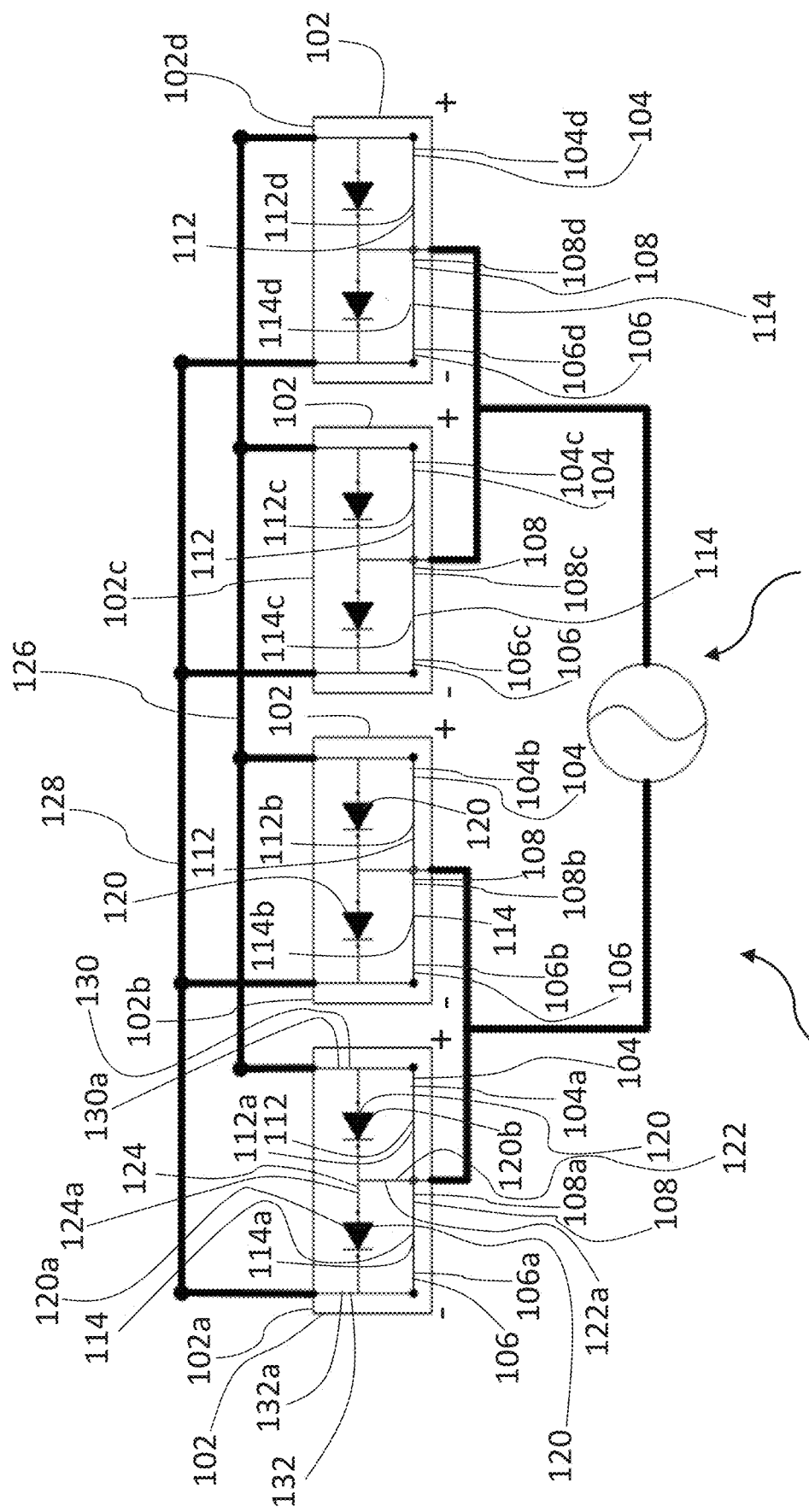
FIG. 4 is a schematic illustration of the switching device of FIG. 2 in the on configuration.

FIG. 4 illustrates the on, or make, configuration of the switching device 200, which is substantially the same as the on configuration of the switching devices 100, 300, and other switching devices described herein. As discussed above, in the on configuration the contact 112 contacts the first connection terminal 104 and the contact 114 contacts the switch terminal 108. The contact between the contact 112 and the first connection terminal 104 and the contact 114 and the switch terminal 108 completes a module circuit within the module 102 to allow the flow of current within the module 102 and between modules 102 as discussed further herein.

The controller 110 is configured to switch the device 200 to the on configuration by closing the contacts 112, 114. As shown, the controller 110 is communicatively coupled to the switching terminal 108 of each of the modules 102. When the device 200 is switched to the on configuration, the controller 110 provides a signal to each of the switch terminals 108 to close the contact 112. When the contact 112 contacts the first connection terminal 104, the current travels through the circuit pathway 124 until it reaches the second connection terminal 106, triggering the closing of the contact 114 to close the module circuit. The current travels so that when the controller 110 provides the signal, the closing of the contacts 112 and 114 are nearly simultaneous. the switch bypass pathway 122 may be provided from the switch terminal 108 to the circuit pathway 124 between the first connection terminal 104 and the second connection terminal 106 to provide a quicker connection from the switch terminal 108 to the second connection terminal 106 to facilitate quick closure of the contact 114, i.e. the controller sends a signal to the switch terminal 108 to close the contact 112 and the signal continues via the bypass pathway 122 and the circuit pathway 124 to close the contact 114 and complete the module circuit.

The current further flows from the first connection terminal 104 to the first connection pathway 126 via the first terminal pathway 130 so that the current flows between the first connection terminals 104 of each module 102. The current also flows between the second connection terminal 106 to the second connection pathway 128 via the second terminal pathway 132 so that the current flows between the second connection terminals 106 of each module 102. The flow of current between the modules 102 completes the circuit device of the device 200.

As discussed above, each of the modules 102 includes a pair of rectified diodes 120 to direct the flow of current. Illustratively, the modules 102 include two rectified diodes 120, a natural body diode 120a and a parallel diode 120b, wherein the parallel diode 120b facilitates increased performance of the module 102. In other embodiments, only the natural body diode 120a may be present. The diodes 120 are positioned intermediate of the first connection terminal 104 and the second connection terminal 106 along the circuit pathway 124 to avoid backflow of current. In other words, the diodes 120 are positioned along the circuit pathway 124 between the first terminal pathway 130 and the second terminal pathway 132.

The diodes 120 dictate the direction of the current within each module 102. In some modules 102, for example modules 102a and 102c, the current flows in a forward direction illustrated by the diode shape illustrated in FIG. 4. In other modules 102, for example modules 102b and 102d, the current flows in a reverse direction illustrated by the diode shape illustrated in FIG. 4. The current flows in the either the forward direction or the reverse direction dictated by the diodes 120 as long as the controller 110 places the device 200 in the on configuration. When the controller 110 is switched to place the device 200 in the off configuration, the contact 112 is removed from the first connection terminal 104 and the contact 114 is removed from the switch terminal 108 to "break" the current, placing the device 200 in the off configuration as illustrated and described by FIG. 2 above.

While the invention has been described by reference to various specific embodiments it should be understood that numerous changes may be made within the spirit and scope of the inventive concepts described, accordingly, it is intended that the invention not be limited to the described embodiments but will have full scope defined by the language of the following claims.

What is claimed is:

1. A switching device, comprising:
a controller;
a first insulated-gate bipolar transistor communicatively coupled to the controller and comprising a first connection terminal and a second connection terminal, the second connection terminal comprising a first contact to selectively place the second connection terminal of the first insulated-gate bipolar transistor in communication with the first connection terminal of the first insulated-gate bipolar transistor to close a module circuit of the first insulated-gate bipolar transistor; and a second insulated-gate bipolar transistor communicatively coupled to the controller and comprising a first connection terminal and a second connection terminal, the second connection terminal of the second insulated-gate bipolar transistor comprising a second contact to selectively place the second connection terminal of the second insulated-gate bipolar transistor in communication with the first connection terminal of the second insulated-gate bipolar transistor to close a module circuit of the second insulated-gate bipolar transistor;

a third insulated-gate bipolar transistor communicatively coupled to the controller and comprising a first connection terminal and a second connection terminal; and a fourth insulated-gate bipolar transistor communicatively coupled to the controller and comprising a first connection terminal and a second connection terminal;

wherein the first connection terminal of the first insulated-gate bipolar transistor is communicatively coupled to the first connection terminal of the second insulated-gate bipolar transistor and the second connection terminal of the first insulated-gate bipolar transistor is communicatively coupled to the second connection terminal of the second insulated-gate bipolar transistor; and the second connection terminal of the third insulated-gate bipolar transistor comprises a third contact to place the second connection terminal of the third insulated-gate bipolar transistor in communication with the first connection terminal of the third insulated-gate bipolar transistor to close a module circuit of the third insulated-gate bipolar transistor; and the second connection terminal of the fourth insulated-gate bipolar transistor comprises a fourth contact to place the second connection terminal of the fourth insulated-gate bipolar transistor in communication with the first connection terminal of the fourth insulated-gate bipolar transistor to close a module circuit of the fourth insulated-gate bipolar transistor.

2. The switching device of claim 1, wherein each of the first insulated-gate bipolar transistor and the second insulated-gate bipolar transistor comprises:

a switch terminal communicatively coupled to the controller and the module circuit, the switch terminal comprising a switch terminal contact.

3. The switching device of claim 1, wherein the switching device is configured to switch between an on configuration and an off configuration.

4. The switching device of claim 2, wherein the first contact of the first insulated-gate bipolar transistor is configured to selectively contact the switch terminal of the first insulated-gate bipolar transistor and the switch terminal contact of the switch terminal of the first insulated-gate bipolar transistor is configured to selectively contact the first connection terminal of the first insulated-gate bipolar transistor.

5. The switching device of claim 1, wherein the switching device comprises at least six insulated-gate bipolar transistors.

6. The switching device of claim 1, each of the first insulated-gate bipolar transistor and the second insulated-gate bipolar transistor further comprising a rectifying diode positioned between the first connection terminal and the second connection terminal.

7. The switching device of claim 1,
wherein the first connection terminal of each of the first insulated-gate bipolar transistor, the second insulated-gate bipolar transistor, the third insulated-gate bipolar transistor, and the fourth insulated-gate bipolar transistor are communicatively coupled to each of the other first connection terminals; and wherein the second connection terminal of each of the first insulated-gate bipolar transistor, the second insulated-gate bipolar transistor, the third insulated-gate bipolar transistor, and the fourth insulated-gate bipolar transistor are communicatively coupled to each of the other second connection terminals.

8. The switching device of claim 3, wherein, in the on configuration, the module circuit of the first insulated-gate bipolar transistor, the module circuit of the second insulated-gate bipolar transistor, the module circuit of the third insulated-gate bipolar transistor, and the module circuit of the fourth insulated-gate bipolar transistor are closed, and, in the off configuration, the module circuit of the first insulated-gate bipolar transistor, the module circuit of the second insulated-gate bipolar transistor, the module circuit of the third insulated-gate bipolar transistor, and the module circuit of the fourth insulated-gate bipolar transistor are open.

9. A method of providing electrical current with the switching device of claim 1, the method comprising:
providing a first signal to a switch terminal of the first insulated-gate bipolar transistor;
closing a switch terminal contact of the switch terminal of the first insulated-gate bipolar transistor so that the switch terminal contact contacts the first connection terminal of the first insulated-gate bipolar transistor;
providing a second signal to the second connection terminal of the first insulated-gate bipolar transistor;
closing the first contact of the second connection terminal of the first insulated-gate bipolar transistor so that the first contact contacts the switch terminal.

10. The method of claim 9, wherein the first signal and the second signal are each provided by the controller.

11. The switching device of claim 1, wherein the first insulated-gate bipolar transistor and the second insulated-gate bipolar transistor form a parallel architecture.

* * * * *